United States Patent
Rush

(10) Patent No.: US 9,794,057 B1
(45) Date of Patent: Oct. 17, 2017

(54) METHOD AND SYSTEM FOR SYNTHETICALLY SAMPLING INPUT SIGNAL

(75) Inventor: Kenneth Rush, Colorado Springs, CO (US)

(73) Assignee: Keysight Technologies, Inc., Santa Rosa, CA (US)

( * ) Notice: Subject to any disclaimer, the term of this patent is extended or adjusted under 35 U.S.C. 154(b) by 1594 days.

(21) Appl. No.: 13/097,882

(22) Filed: Apr. 29, 2011

(51) Int. Cl.
 *H04L 7/00* (2006.01)
 *H04L 7/033* (2006.01)

(52) U.S. Cl.
 CPC .......... *H04L 7/0337* (2013.01); *H04L 7/0334* (2013.01)

(58) Field of Classification Search
 USPC .................... 375/355; 372/22; 359/328, 329; 342/193; 327/119; 324/623
 See application file for complete search history.

(56) References Cited

U.S. PATENT DOCUMENTS

| | | | |
|---|---|---|---|
| 5,446,923 A * | 8/1995 | Martinson et al. ............ | 455/330 |
| 5,787,126 A * | 7/1998 | Itoh et al. ..................... | 375/340 |
| 6,108,529 A * | 8/2000 | Vice et al. ..................... | 455/323 |
| 6,421,403 B1 | 7/2002 | Limberg | |
| 6,456,602 B1 * | 9/2002 | Hwang et al. ................. | 370/307 |
| 6,647,250 B1 * | 11/2003 | Bultman et al. ............... | 455/102 |
| 6,707,338 B2 | 3/2004 | Kenington et al. | |
| 7,219,037 B2 | 5/2007 | Pupalaikis et al. | |
| 8,045,066 B2 * | 10/2011 | Vorenkamp et al. ......... | 348/726 |
| 8,285,240 B2 * | 10/2012 | Seendripu et al. ........... | 455/317 |
| 8,285,540 B2 * | 10/2012 | Sato et al. ........................ | 704/9 |
| 2004/0097214 A1 * | 5/2004 | Gard et al. ..................... | 455/323 |
| 2006/0205370 A1 * | 9/2006 | Hayashi et al. ............... | 455/209 |
| 2006/0293017 A1 * | 12/2006 | Kim et al. ..................... | 455/323 |
| 2007/0281656 A1 * | 12/2007 | Rostami et al. ............... | 455/323 |
| 2008/0100755 A1 * | 5/2008 | Wang et al. ................... | 348/731 |
| 2009/0004975 A1 * | 1/2009 | Craninckx ...................... | 455/74 |
| 2009/0061812 A1 * | 3/2009 | VanWiggeren et al. ....... | 455/326 |
| 2009/0065696 A1 * | 3/2009 | Mann et al. ............. | 250/339.06 |
| 2009/0156155 A1 * | 6/2009 | Krug et al. .................... | 455/313 |
| 2011/0053522 A1 * | 3/2011 | Rofougaran et al. ........... | 455/73 |

* cited by examiner

*Primary Examiner* — Shuwang Liu
*Assistant Examiner* — Sung Ahn

(57) ABSTRACT

A system for synthetically sampling an input signal to provide a sampled signal includes a sample clock and a mixer. The sample clock is configured to generate a sampling signal having a sampling frequency. The mixer is configured to receive the sampling signal and the input signal, and to output an intermediate frequency (IF) signal by mixing the sampling signal and the input signal. An offset voltage is introduced into the mixer with the sampling signal to provide a baseband image, the offset voltage being adjusted so that the baseband image of the IF signal has the same magnitude as a first harmonic image of the IF signal.

20 Claims, 13 Drawing Sheets

METHOD AND SYSTEM FOR SYNTHETICALLY SAMPLING INPUT SIGNAL

BACKGROUND

Oscilloscopes, data recording devices and other test instrumentation use sampling circuits, which sample input signals at a predetermined sampling rate or sampling frequency. A typical sampling circuit includes a sampling switch, a capacitor connected between the sampling switch and ground, an amplifier, and a digitizer (e.g., analog to digital converter (ADC)), for example.

Conventional sampling circuits include narrow aperture sampling circuits. Aperture refers to the window during which an input signal is sampled. For a narrow aperture sampling circuit to have high bandwidth, the aperture must be very narrow in time. However, as the aperture becomes more narrow, gain of the narrow aperture sampling circuit becomes lower, resulting in very low gain when sampling high bandwidth input signals. From sampling theory, a perfect zero-aperture sampling circuit produces infinite bandwidth samples, but has zero gain. To compensate for the low gain at narrow apertures, the sampled signal may be amplified, but this results in increased noise. Therefore, a conventional narrow aperture sampling circuit generally produces an attenuated image of the original input signal, plus additional images of the original input signal symmetric about the sample frequency and its harmonics. A result of spreading the energy of the original input signal is that the gain of all the images goes down.

Conventional sampling circuits further include track and hold circuits and sample and hold circuits. Track and hold circuits, in track mode, must track to full bandwidth on a capacitive load, which is used to hold the sampled value of the input signal when a switch is turned off. There are inherent tradeoffs between achievable bandwidth, acquire time and hold time. Sample and hold circuits require the holding capacitor to be reset after a sample is digitized.

SUMMARY

In a representative embodiment, a system for synthetically sampling an input signal to provide a sampled signal includes a sample clock and a mixer. The sample clock is configured to generate a sampling signal having a sampling frequency. The mixer is configured to receive the sampling signal and the input signal, and to output an intermediate frequency (IF) signal by mixing the sampling signal and the input signal. An offset voltage is introduced into the mixer with the sampling signal to provide an additional baseband image, the offset voltage being adjusted so that the baseband image of the IF signal has the same magnitude as a first harmonic image of the IF signal.

In another representative embodiment, a system for synthetically sampling an input signal to provide a sampled signal includes a sample clock, a splitter, a mixer and a combiner. The sample clock is configured to generate a sampling signal having a sampling frequency. The splitter is configured to split the input signal into a first split input signal and a second split input signal. The mixer is configured to receive the sampling signal and the first split input signal, and to output an IF signal having an intermediate frequency by mixing the sampling signal and the first split input signal. The combiner is configured to sum the IF signal output by the mixer and the second split input signal output by the splitter, and to output a combined signal at the intermediate frequency. A magnitude of at least one of the IF signal and the second split input signal is adjusted, so that a magnitude of a baseband image matches a magnitude of a first harmonic image of the combined IF signal output by the combiner.

In another representative embodiment, a method is provided for synthetically sampling a radio frequency (RF) input signal to provide a sampled signal. The method includes receiving the RF input signal and a sampling signal having a sampling frequency; mixing at least a portion of the RF input signal and the sampling signal to provide an IF signal having at least a first harmonic image; and adjusting a magnitude of at least one of the first harmonic image and a baseband image so that the magnitude of the first harmonic image matches the magnitude of the baseband image.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
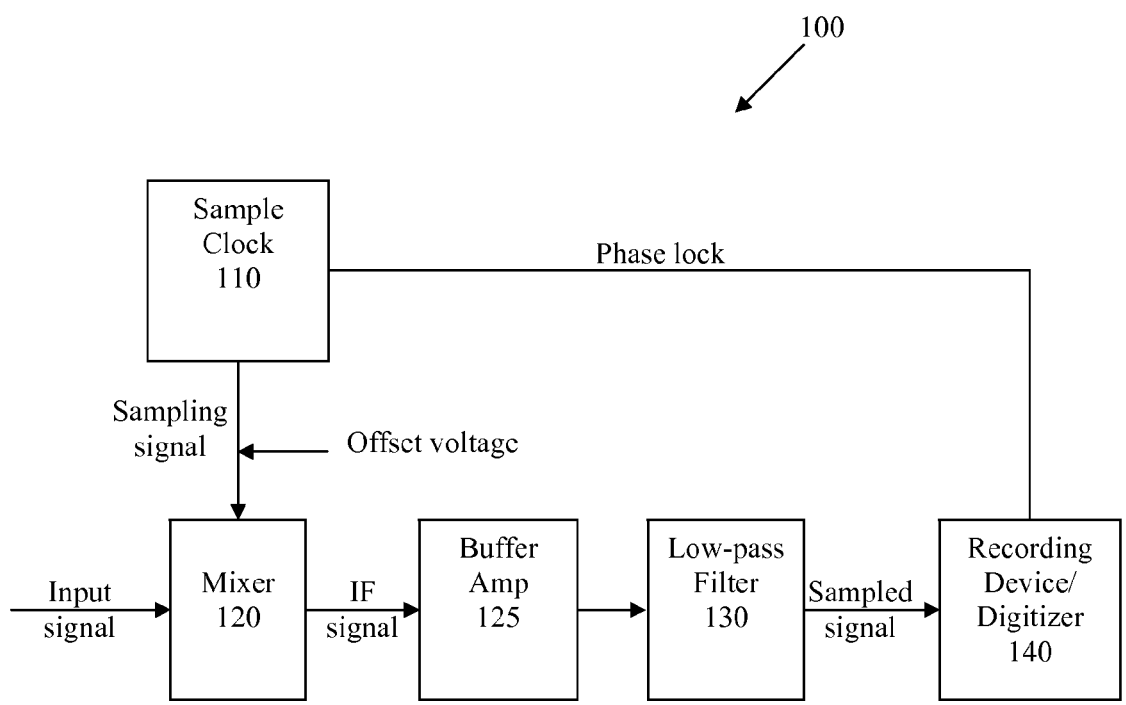
FIG. 1 is a block diagram illustrating a system for synthetically sampling an input signal, according to a representative embodiment.

In the following detailed description, for purposes of explanation and not limitation, illustrative embodiments disclosing specific details are set forth in order to provide a thorough understanding of embodiments according to the present teachings. However, it will be apparent to one having had the benefit of the present disclosure that other embodiments according to the present teachings that depart from the specific details disclosed herein remain within the scope of the appended claims. Moreover, descriptions of well-known devices and methods may be omitted so as not to obscure the description of the example embodiments. Such methods and devices are within the scope of the present teachings.

Generally, it is understood that the drawings and the various elements depicted therein are not drawn to scale. Further, relative terms, such as "above," "below," "top," "bottom," "upper," "lower," "left," "right," "vertical" and "horizontal," are used to describe the various elements' relationships to one another, as illustrated in the accompanying drawings. It is understood that these relative terms are intended to encompass different orientations of the device and/or elements in addition to the orientation depicted in the drawings. For example, if the device were inverted with respect to the view in the drawings, an element described as "above" another element, for example, would now be "below" that element. Likewise, if the device were rotated 90 degrees with respect to the view in the drawings, an element described as "vertical," for example, would now be "horizontal."

Generally, various embodiments provide sampling systems and methods for obtaining high quality, high gain samples of an input signal having very high bandwidth. The bandwidth of the corresponding output (sampled) signal is the minimum needed to obtain signal content, avoiding redundant signal content and wasted energy. A synthetic sampling system may be constructed using a conventional doubly balanced mixer, for example. The output of the doubly balanced mixer may be filtered to a bandwidth centered on zero Hertz, and contained between $-f_S/2$ and $f_S/2$. It has been observed that this bandwidth is sufficient to provide all of the required signal content to obtain accurate samples of the input signal. In other words, the doubly balanced mixer and the filter create signal content that folds on top of other signal content, compacting the full bandwidth of the input signal into a smaller bandwidth. When signal content is folded up into a smaller bandwidth (e.g., $-f_S/2$ to $f_S/2$), the smaller bandwidth can be recorded by existing recording means. In addition, the bandwidth of the input signal may exceed the sampling frequency without loss of the ability to produce high quality samples of the input signal.

FIG. 1 is a block diagram illustrating a system for synthetically sampling an input signal, according to a representative embodiment.

Referring to FIG. 1, sampling system 100 includes sample clock 110, mixer 120, buffer amplifier 125 and low-pass filter 130. The sampling system 100 generally receives an input signal at input frequency $f_{in}$, samples the input signal at sampling frequency $f_S$ to obtain a sampled signal, and provides the (amplified and filtered) sampled signal to receiver 140 for recording and/or analysis. The input signal may be a radio frequency (RF) signal, for example.

The sample clock 110, which essentially functions as a local oscillator (LO) using mixer terminology, generates a sampling signal at the sampling frequency fS. The mixer 120 receives the sampling signal and the input signal, e.g., at an LO input and an RF input, respectively, and outputs an intermediate frequency (IF) signal having an intermediate frequency $f_{IF}$ by mixing the sampling signal and the input signal. In various embodiments, the mixer 120 may be a doubly balanced mixer, for example, such that the IF signal output by the mixer 120 consists of only a down-converted image about the first harmonic of an LO signal (and no baseband image) at relatively high signal levels, e.g., as compared to a narrow aperture sampling circuit, as discussed below. Generally, a doubly balanced mixer multiplies the input signal by the sampling signal to produce the IF signal, taking advantage of the following mathematic identity: $\cos(x)*\cos(y)=(\cos(x+y)+\cos(x-y))/2$. In other words, by multiplying one cosine wave by another cosine wave, two new cosine waves are produced, one at the sum of the two original frequencies and one at the difference of the two original frequencies. Also, for an ideal mixer, there is no signal content at the original input frequency. Notably, it is possible to overdrive the LO input of a doubly balanced mixer (e.g., mixer 120) and still achieve useful results. This generally increases the conversion gain of the doubly balanced mixer, and requires multiplying a sine-wave input (e.g., input signal) by an effective square wave LO signal (e.g., sampling signal), as would be apparent to one of ordinary skill in the art. Resulting unwanted images may be output about the harmonics of the LO signal, which are filtered out (e.g., by low-pass filter 130).

In the depicted embodiment, an adjustable offset voltage, such as DC offset, is introduced into the LO input of the mixer 120 along with the sampling signal. The offset voltage provides the baseband image of the IF signal, and adjustments to the offset voltage cause corresponding adjustments in magnitude of the baseband image in proportion to the offset voltage. Thus, in an embodiment, by adjusting the offset voltage, the baseband image of the IF signal is adjusted to have the same magnitude as the first harmonic image of the IF signal, as shown for example in FIG. 3D, discussed below. Accordingly, the sampling system 100 effectively functions as a synthetic "zero-aperture" sampler, but with appreciable gain over a narrow aperture sampler circuit, for example. The IF signal is output by the mixer 120 to the buffer amplifier 225, which amplifies the IF signal, and the low-pass filter 130, which limits an upper end of the bandwidth of the IF signal. The low-pass filter 130 outputs the amplified and filtered sampled signal to the receiver 140.

In an embodiment, the cutoff frequency of the low-pass filter 130 is about one half of the sampling frequency $f_S$, such that the bandwidth of the filtered IF signal is contained between about $-f_S/2$ and $f_S/2$. This is because it has been observed that signal content of the IF signal above half the sampling frequency $f_S$ is redundant, so the energy above half the sampling frequency $f_S$ is effectively wasted. However, setting the cutoff frequency of the low-pass filter 130 below one half the sampling frequency $f_S$ would result in unrecoverable loss of signal content. Thus, the cutoff frequency of the low-pass filter 130 should be set near or slightly above one half the sampling frequency $f_S$ to minimize redundant information, but not lower than one half the sampling frequency $f_S$ to avoid losing information.

Figure 3A:
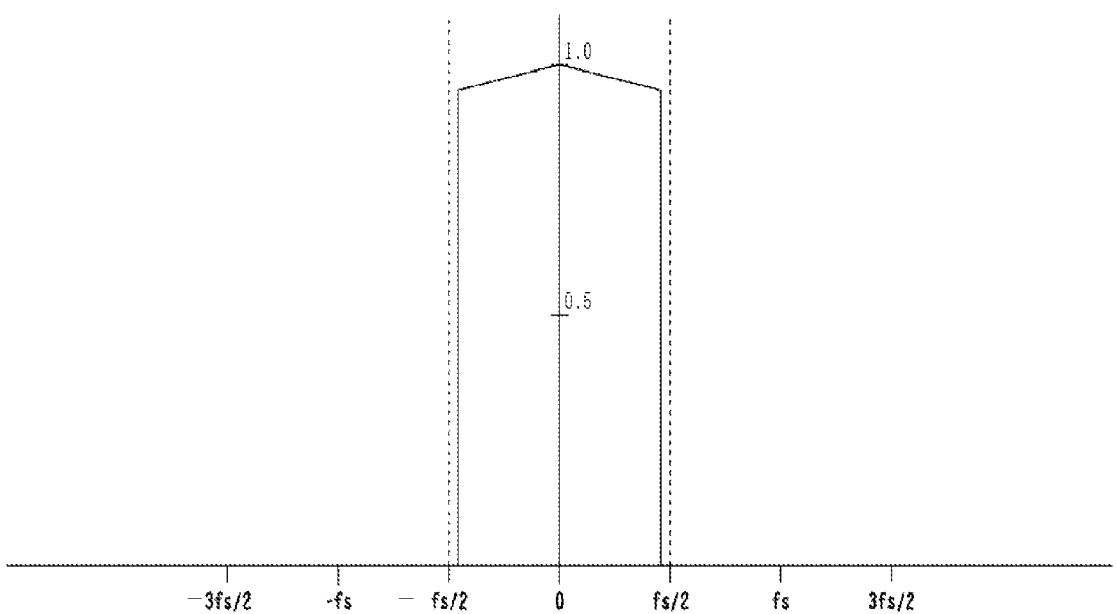
FIGS. 3A-3D are frequency response traces of signals illustrating operation of a conventional sampling system and a synthetic sampling system, according to representative embodiments.
Figure 3B:
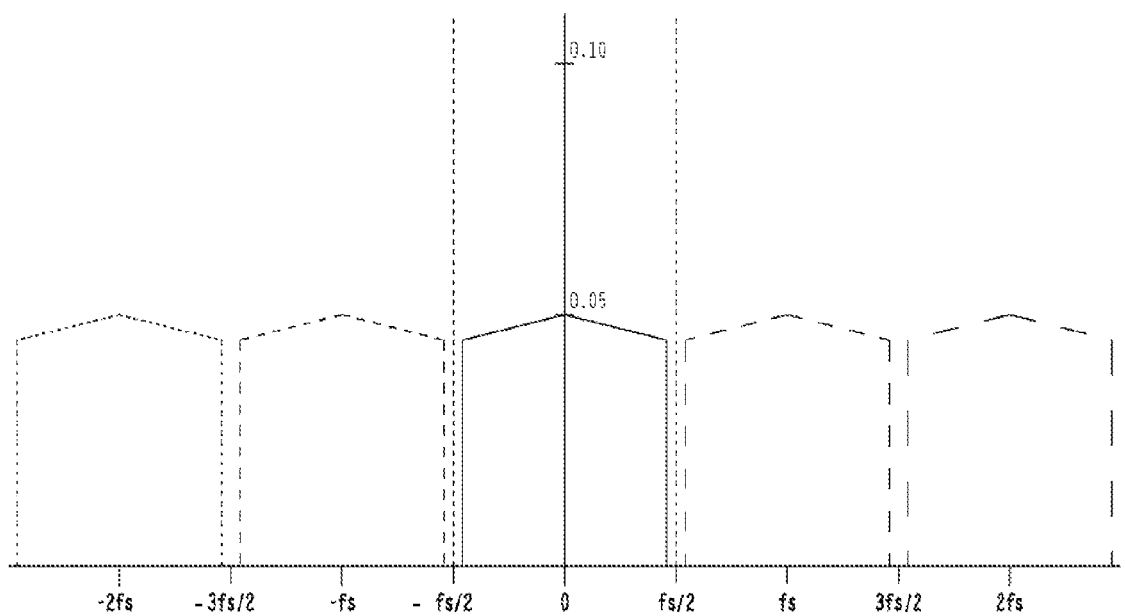
Figure 3C:
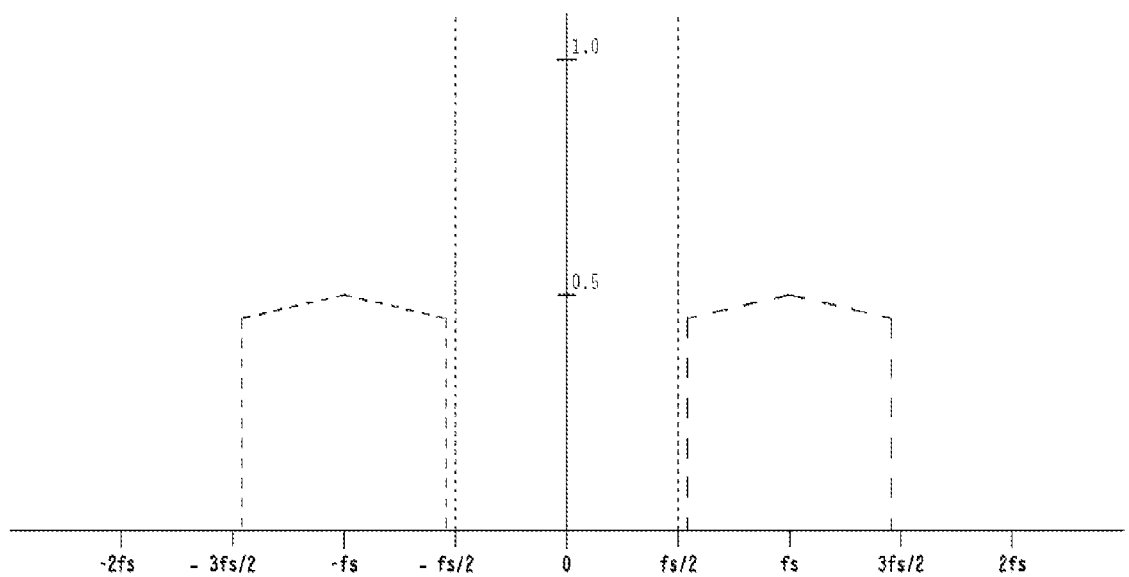
Figure 3D:
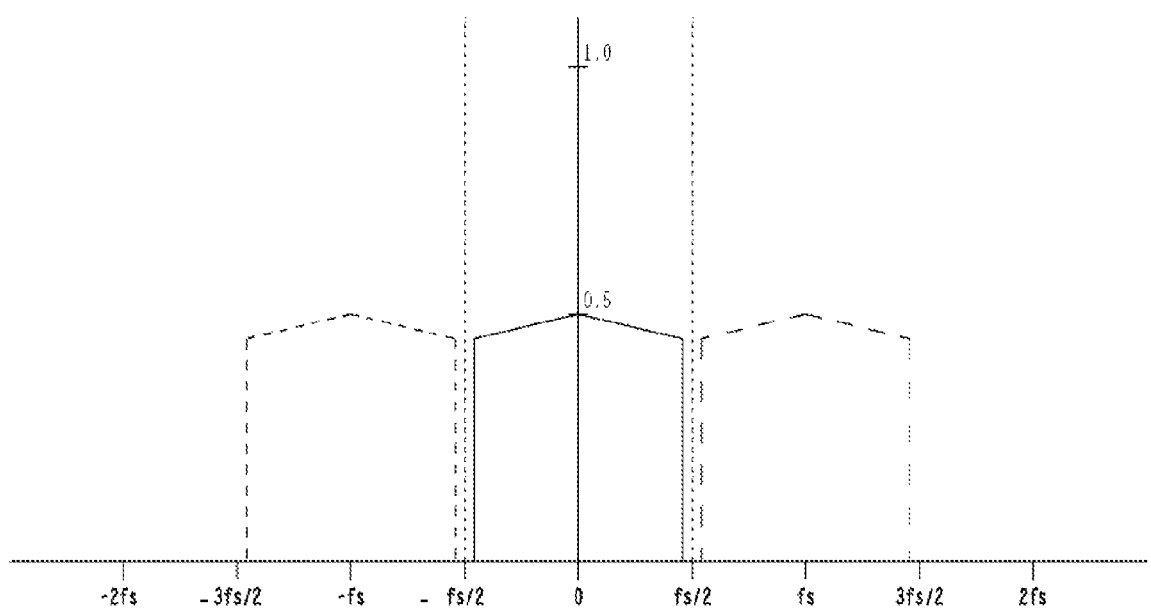

For example, when the bandwidth of the input signal is less than one half the sampling frequency $f_S$ ($f_S/2$), the baseband of the IF signal is contained entirely within the bandwidth $-f_S/2$ to $f_S/2$ (e.g., as shown in FIG. 3D, discussed below). When the bandwidth of the input signal is greater than one half the sampling frequency $f_S$ ($f_S/2$) and less than the sampling frequency $f_S$, the baseband of the IF signal extends beyond the bandwidth $-f_S/2$ to $f_S/2$. However, the signal content outside the bandwidth $-f_S/2$ to $f_S/2$ is captured from the first harmonic image, portions of which extend into the bandwidth $-f_S/2$ to $f_S/2$ (e.g., as shown in FIG. 4B, discussed below). Similarly, when the bandwidth of the input signal is greater than the sampling frequency $f_S$ and less than one and a half times the sampling frequency $f_S$ ($3f_S/2$), the baseband of the IF signal extends beyond the bandwidth $-f_S/2$ to $f_S/2$. However, the signal content outside the bandwidth $-f_S/2$ to $f_S/2$ is captured from the first harmonic image, portions of which extend into the bandwidth $-f_S/2$ to $f_S/2$ (e.g., as shown in FIG. 5B, discussed below). This may be referred to as the signal content being folded into the bandwidth $-f_S/2$ to $f_S/2$. Because the baseband image and the first harmonic image of the IF signal have the same magnitude, as discussed above, the portions of the signal content provided by the baseband image would be effectively indistinguishable, from a signal strength perspective, from portions of the signal content provided by the first harmonic image.

The receiver 140 may be an oscilloscope channel or a digital recording device, for example, and includes an analog-to-digital converter (ADC) for digitizing the sampled signal prior to analysis and/or recording. The receiver 140 must have enough bandwidth to cover the output of the low-pass filter 130 to receive the sampled signal. As shown in FIG. 1, the sample clock 110 is phase locked to the digitizing process in the ADC of the receiver 140, such that the waveform of the sampled signal may be digitized at the proper phase. When the ADC does not digitize at the proper phase, the digital IF record must be demodulated by multiplying the IF record by a digital representation of the original analog sampling signal, which has the same phase.

Figure 2:
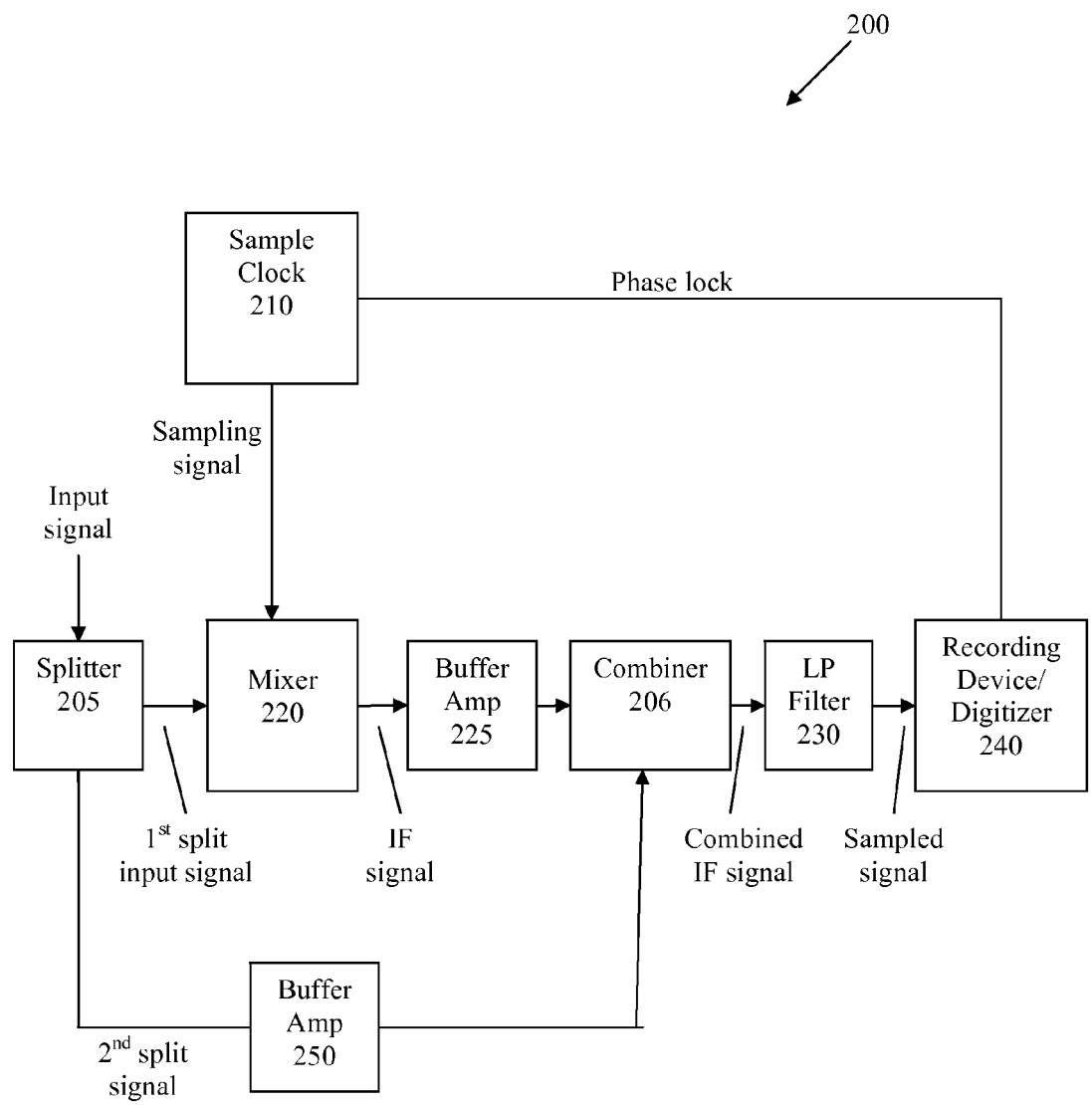
FIG. 2 is a block diagram illustrating a system for synthetically sampling an input signal, according to another representative embodiment.

FIG. 2 is a block diagram illustrating a system for synthetically sampling an input signal, according to another representative embodiment.

Referring to FIG. 2, sampling system 200 includes sample clock 210, mixer 220, buffer amplifier 225, and low-pass filter 230, which are substantially the same as the sample clock 110, the mixer 120, the buffer amplifier 125 and the low-pass filter 130 discussed above with reference to FIG. 1. In addition, the sampling system 200 includes splitter 205, combiner 206 and buffer amplifier 250. The sampling system 200 generally receives an input signal at input frequency $f_{in}$, samples the input signal at sampling frequency $f_S$ to obtain a sampled signal, and provides the (amplified and filtered) sampled signal to receiver 240. The receiver 240 may be an oscilloscope channel or a digital recording device, for example, and includes an ADC for digitizing the sampled signal.

The splitter 205 splits the input signal into a first split input signal and a second split input signal, each of which may have a full bandwidth of the original input signal. Each of the first and second split input signals may be half of the input signal, for example. The splitter 205 may be any device capable of splitting the input signal, such as a diplexer, a power splitter or an amplifier having two inputs, for example. When the splitter 205 is a diplexer, the first and second split signals are not full bandwidth, but rather may divide the bands, such that the baseband need not extend beyond $f_S/2$, and the high band need not extend below $f_S/2$.

The mixer 220 receives a sampling signal from the sample clock 210 and the first split input signal from the splitter 205, e.g., at an LO input and an RF input, respectively, and outputs an IF signal having an intermediate frequency $f_{IF}$ by mixing the sampling signal (having zero offset) and the first split input signal. The sample clock 210 generates the sampling signal at the sampling frequency $f_S$. As discussed above with reference to the mixer 120, the mixer 220 may be a doubly balanced mixer, for example, such that the IF signal output by the mixer 220 consists of only a first harmonic image (and no baseband image) at relatively high signal levels.

In the depicted embodiment, the combiner 206 receives the IF signal from the mixer 220 through the buffer amplifier 225 and the second split input signal from the splitter 205 through the buffer amplifier 250. The combiner 206 may be any device capable of combining the input signal with the IF signal, such as a power splitter used in reverse order or an amplifier having two inputs, for example. The combiner 206 is configured to combine (e.g., sum) the IF signal output by the buffer amplifier 225 and the second split input signal output by the buffer amplifier 250, and to output a combined IF signal in the IF frequency band. Thus, the output of the combiner 206 includes the baseband image and the IF signal. In the depicted embodiment, the magnitude of the IF signal is adjustable via buffer amplifier 225. The IF signal is easily adjusted because it is AC coupled and amplifiers (e.g., buffer amplifier 225) are widely available. Therefore, the magnitude of the first harmonic image of the IF signal output by the mixer 220 may be adjusted to match the magnitude of the baseband image output by the splitter 205, so that the magnitudes of the first harmonic image and the baseband image of the combined IF signal output by the combiner 206 are the same, as shown for example in FIG. 3D, discussed below. In alternative embodiments, the magnitude of the second split input signal may be adjusted, via buffer amplifier 250, instead of or in addition to the magnitude of the IF signal, resulting in the same magnitudes of the baseband image and the first harmonic image in the combined IF signal. Accordingly, the sampling system 200 effectively functions as a synthetic zero-aperture sampler, but with appreciable gain.

The combined IF signal is output by the combiner 206 to the low-pass filter 230, which limits an upper end of the bandwidth of the combined IF signal and outputs the sampled signal to the receiver 240. In an embodiment, the cutoff frequency of the low-pass filter 230 is about one half of the sampling frequency $f_S$, as discussed above. The sample clock 210 is phase locked to the digitizing process in the ADC of the receiver 240, such that the waveform of the sampled signal may be digitized at the proper phase.

For some input signals, the sample density in time from one synthetic sampling system (e.g., sampling system 100, 200) may not be sufficient to obtain a non-aliased record of the input signal. In that case, samples produced by additional synthetic sampling systems may be interleaved in time to achieve the required sample density, avoiding aliasing in the composite record.

Additionally, samples from one synthetic sampling system can be band limited and further sampled by a second rank of synthetic sampling systems to further compact signal content into smaller bandwidths. For example, multiple ranks may be used to further reduce the bandwidth requirements of recording media. In an embodiment, a system including multiple sampling systems (e.g., sampling system 100, 200) may be constructed in up to three sampling phases. However, because the mixer (mixer 120, 220) does not generate higher order images beyond the first harmonic image, there is no "third image" centered about the second harmonic frequencies of the sampling frequency $f_S$ that can fold into the baseband, therefore effectively limiting synthetic sampling to three samplers per rank level.

FIGS. 3A-3D are frequency response traces of signals illustrating operation of a conventional sampling system and a synthetic sampling system, where input signal bandwidth is contained below $f_S/2$, according to representative embodiments.

FIG. 3A shows a baseband of a representative RF input signal with bandwidth limited to less than $f_S/2$, e.g., which is received by a conventional narrow aperture sampling circuit or a representative synthetic sampling system, described herein. The baseband of the RF input signal is centered around zero (Hertz) in this example, and is contained between $-f_S/2$ and $f_S/2$. The magnitude of the input signal is indicated as "1".

FIG. 3B shows the output signal of a conventional narrow aperture sampling circuit based on the RF input signal of FIG. 3A, where the input signal is contained between $-f_S/2$ and $f_S/2$. The output signal includes a baseband image centered around zero and a number of harmonic images centered around the sampling frequency $f_S$ and its corresponding harmonic frequencies (e.g., at least first through second harmonics are illustrated in this example), respectively. The baseband and harmonic images have the same magnitude, although the magnitude is quite low (e.g., about 0.05) as compared to the magnitude of the RF input signal.

In comparison, FIG. 3C shows the output signal of an ideal doubly balanced mixer based on the RF input signal of FIG. 3A, where the input signal bandwidth is contained between $-f_S/2$ and $f_S/2$. The output signal includes one harmonic image centered around the first harmonic of the sampling frequency $f_S$. However, the output signal does not include a baseband image, as discussed above. Therefore, to achieve synthetic sampling, the baseband image needs to be added into the output signal, according to various representative embodiments.

FIG. 3D thus shows the output signal spectrum (e.g., sampled signal) of a synthetic sampling system, based on the RF input signal of FIG. 3A, where the baseband image has been added to the output signal of the doubly balanced mixer (e.g., mixers 120, 220). The baseband image may be added, for example, by introducing an offset voltage with the sampling signal into the doubly balanced mixer, as described above with reference to FIG. 1. The offset voltage is then adjusted to match the magnitudes of the baseband image and the first harmonic image. Alternatively, the baseband image may be added, for example, by splitting the RF input signal and combining the output of the doubly balanced mixer with a portion of the split RF input signal that bypasses the doubly balanced mixer, as described above with reference to FIG. 2. The magnitude of the output of the doubly balanced mixer and/or the split portion of the RF input signal may then be adjusted so that the magnitudes of the baseband image and the first harmonic image are about the same.

Thus, the output signal includes the baseband image centered around zero (Hertz) and one harmonic image centered around the first harmonic of the sampling frequency $f_S$. Notably, the baseband image and the first harmonic image have relatively high magnitudes (e.g., about 0.5) as compared to the magnitude of the RF input signal, e.g., relative to the output of a narrow aperture sampler. As shown, the magnitude of each of the baseband image and the first harmonic image is about 10 times greater than that of the output signal provided by the conventional narrow aperture sampling circuit shown in FIG. 3B.

Figure 4A:
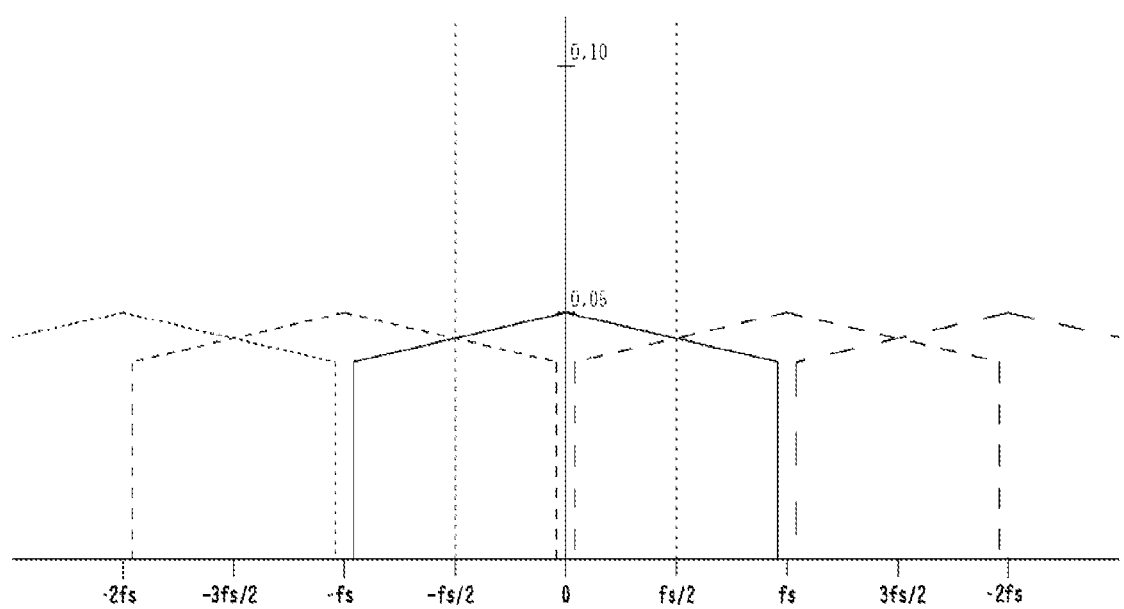
FIGS. 4A-4B are frequency response traces of signals illustrating operation of a conventional sampling system and a synthetic sampling system, according to representative embodiments.
Figure 4B:
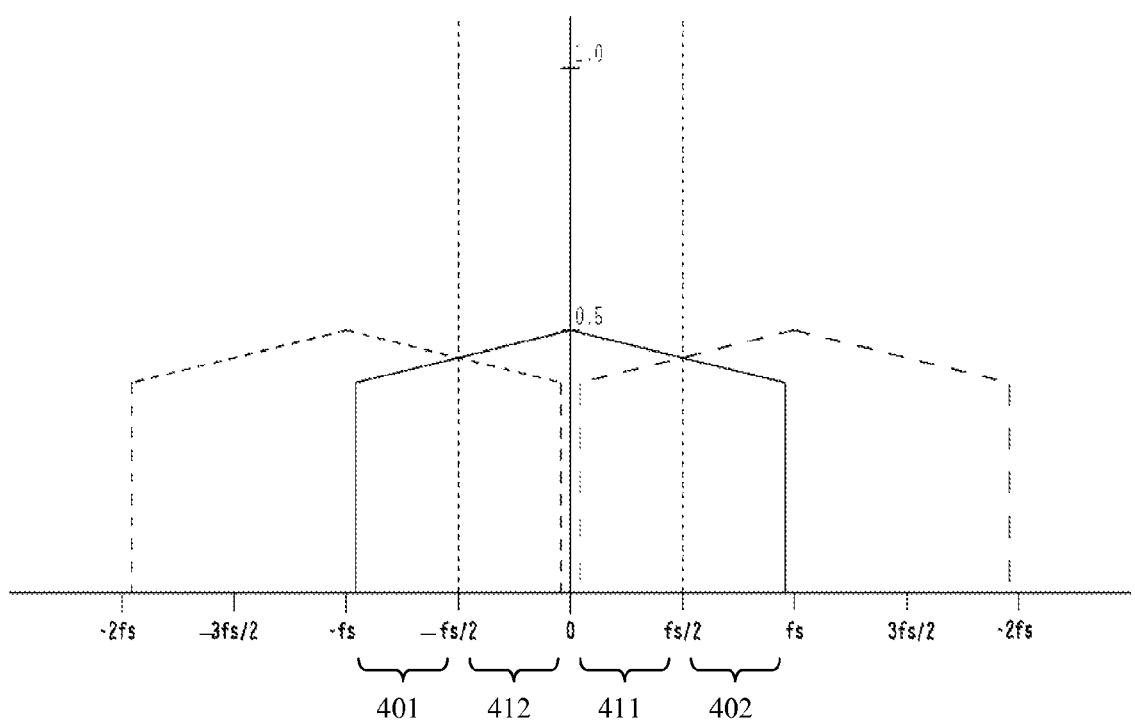

FIGS. 4A-4B are frequency response traces of signals illustrating operation of a conventional sampling system and a synthetic sampling system, where input signal bandwidth extends above $f_S/2$ but is contained below $f_S$, according to representative embodiments.

FIG. 4A shows the output signal of a conventional narrow aperture sampling circuit based on an RF input signal, centered around zero (Hertz) and having a bandwidth greater than $f_S/2$ but less than $f_S$. The magnitude of the input signal is assumed to be "1", in this example. The output signal as shown in FIG. 4A includes a baseband image centered around zero (Hertz) and a number of harmonic images centered around corresponding harmonic frequencies (e.g., at least first through second harmonics) of the sampling frequency $f_S$. The baseband and harmonic images have the same magnitude, although again the magnitude is quite low (e.g., about 0.05) as compared to the magnitude of the RF input signal.

In comparison, FIG. 4B shows the output signal (e.g., sampled signal) of a synthetic sampling system, according to a representative embodiment, based on the same RF input signal as in FIG. 4A. That is, the RF input signal is centered around zero (Hertz), has a bandwidth greater than $f_S/2$ but less than $f_S$, and a magnitude assumed to be "1", in this example. The output signal includes a baseband image centered around zero (Hertz) and one harmonic image centered around the first harmonic of the sampling frequency $f_S$. The magnitudes of the baseband image and/or the first harmonic image are adjusted so that they are the same, as discussed above. The baseband and first harmonic images overlap, but within the band between $-f_S/2$ and $f_S/2$ (indicated by dotted lines), only portions of the base band and the first harmonic image are present. In fact, within the band between $-f_S/2$ and $f_S/2$, the baseband and first harmonic images shown in FIG. 4B are substantially the same as the baseband and first harmonic images shown in FIG. 4A, except that the gain of the baseband and first harmonic images in FIG. 4B is about 10 times higher.

As discussed above, the baseband of the IF signal extends beyond the bandwidth $-f_S/2$ to $f_S/2$, indicated in FIG. 4B by lower portion 401 and upper portion 402 of the baseband. However, this signal content is captured from portions of the first harmonic image that extend into the bandwidth $-f_S/2$ to $f_S/2$. In particular, lower portion 411 of the first harmonic centered on sampling frequency $f_S$ falls within the bandwidth $-f_S/2$ to $f_S/2$ and substantially provides the signal content lost in lower portion 401 of the baseband, and upper portion 412 of the first harmonic centered on negative sampling frequency $-f_S$ falls within the bandwidth $-f_S/2$ to $f_S/2$ and substantially provides the signal content lost in the upper portion 402 of the baseband. In other words, the signal content in the lower portion 411 and the upper portion 412 of the first harmonic image is folded into the bandwidth $-f_{S-}/2$ to $f_S/2$, such that all of the signal content of the IF signal is present at the relatively high gain.

Figure 5A:
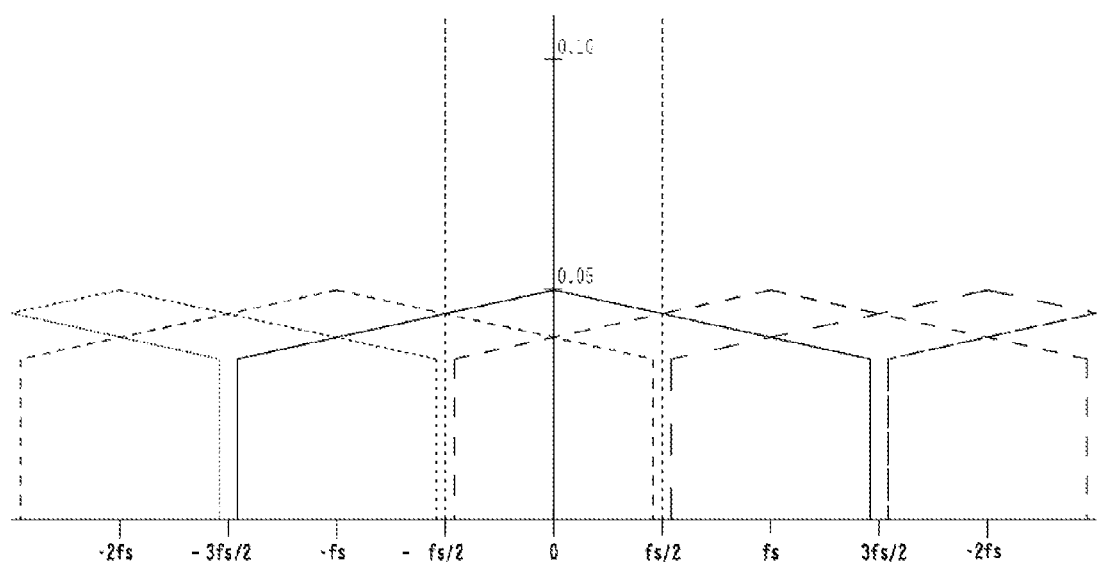
FIGS. 5A-5C are frequency response traces of signals illustrating operation of a conventional sampling system and a synthetic sampling system, according to representative embodiments.
Figure 5B:
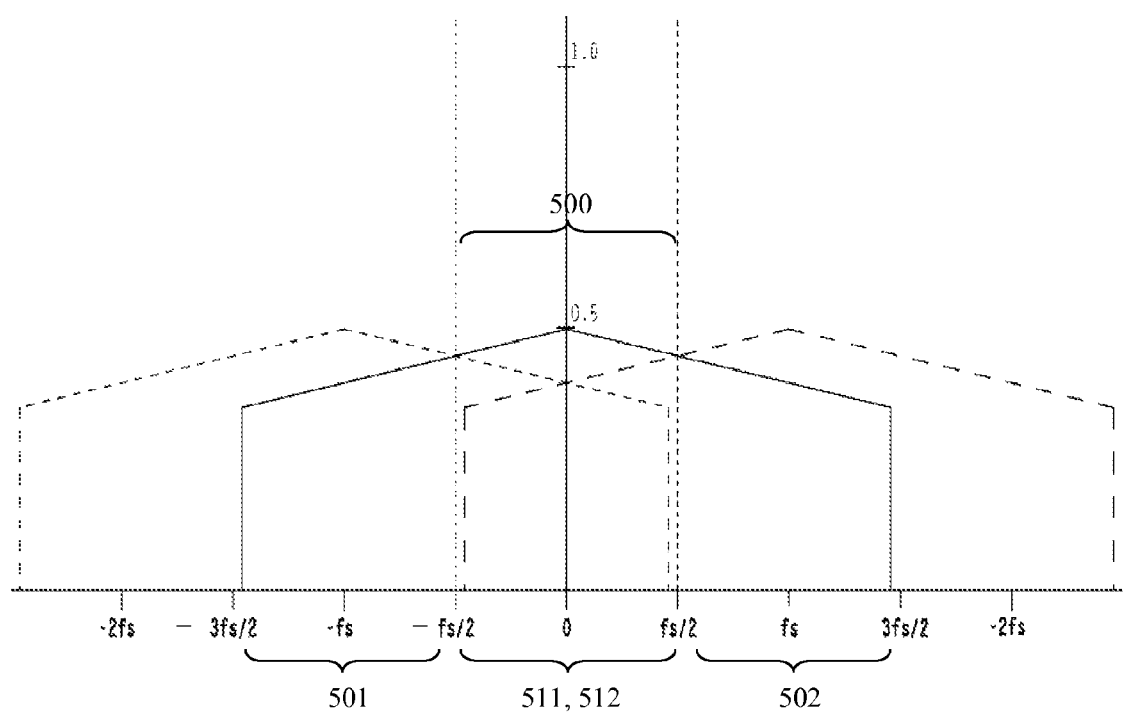
Figure 5C:
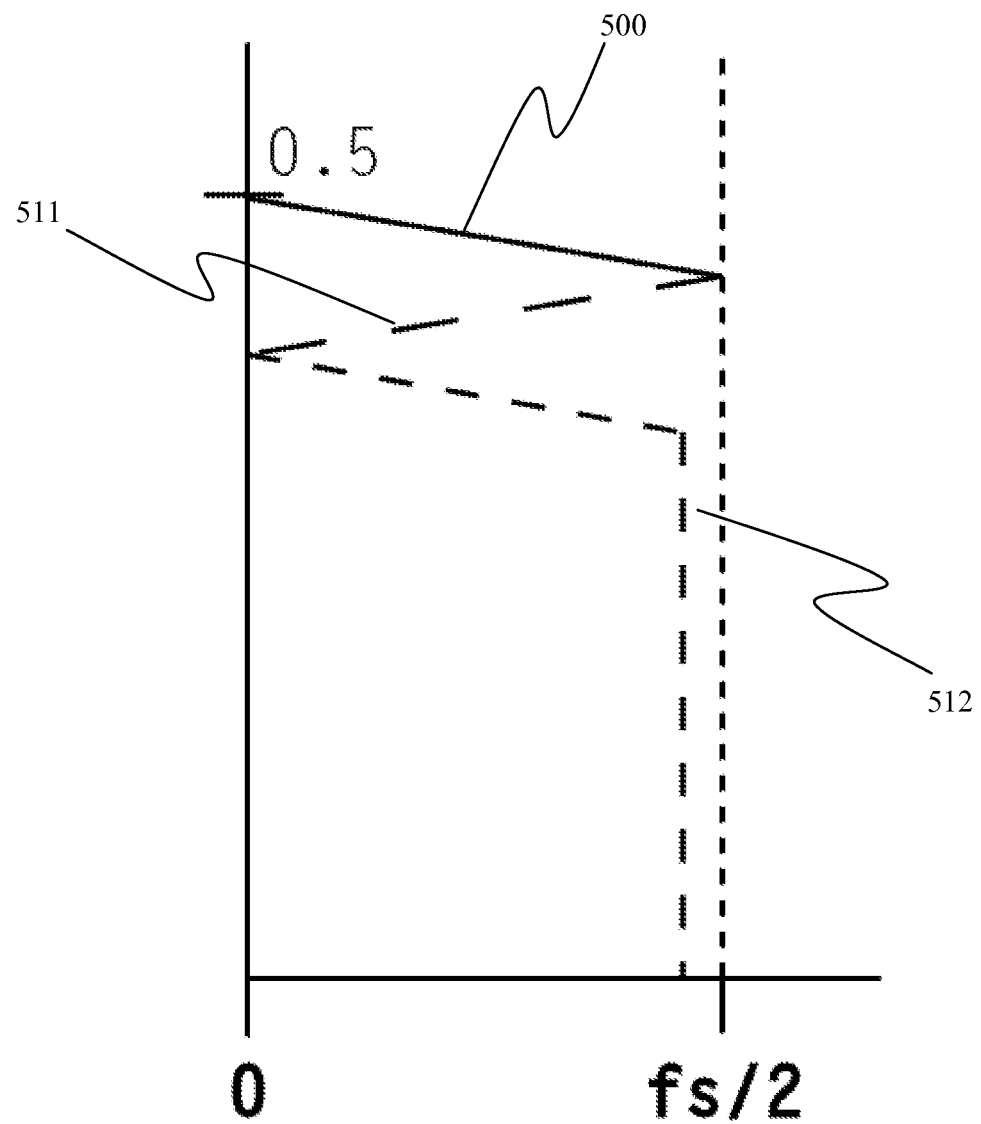

FIGS. 5A-5C are frequency response traces of signals illustrating operation of a conventional sampling system and a synthetic sampling system, where input signal bandwidth extends above $f_S$ but is contained below $3f_S/2$, according to representative embodiments.

FIG. 5A shows the output signal of a conventional narrow aperture sampling circuit based on an RF input signal, centered around zero (Hertz) and having a bandwidth greater than $f_S$ but less than $3f_S/2$. The magnitude of the input signal is assumed to be "1", in this example. The output signal as shown in FIG. 5A includes a baseband image centered around zero (Hertz) and a number of harmonic images centered around corresponding harmonic frequencies (e.g., at least first through second harmonics) of the sampling frequency $f_S$. The baseband and harmonic images have the same magnitude, although again the magnitude is quite low (e.g., about 0.05) as compared to the magnitude of the RF input signal.

In comparison, FIG. 5B shows the output signal (e.g., sampled signal) of a synthetic sampling system, according to a representative embodiment, based on the same RF input signal as in FIG. 5A. That is, the RF input signal is centered around zero (Hertz), has a bandwidth greater than $f_S$ but less than $3f_S/2$, and a magnitude assumed to be "1", in this example. The output signal includes a baseband image centered around zero (Hertz) and one harmonic image centered around the first harmonic of the sampling frequency $f_S$. The magnitudes of the baseband image and/or the first harmonic image are adjusted so that they are the same, as discussed above. The baseband and first harmonic images overlap, but within the band between $-f_S/2$ and $f_S/2$ (indicated by dotted lines), only portions of the base band and the first harmonic image are present. In fact, within the band between $-f_S/2$ and $f_S/2$, the baseband and first harmonic images shown in FIG. 5B are substantially the same as the baseband and harmonic first images shown in FIG. 5A, except that the gain of the baseband and first harmonic images in FIG. 4B is about 10 times higher.

As discussed above, the baseband of the IF signal extends beyond the bandwidth $-f_S/2$ to $f_S/2$, indicated in FIG. 5B by lower portion 501 and upper portion 502 of the baseband. Center portion 500 of the baseband is contained within the bandwidth $-f_S/2$ to $f_{S\_}/2$. However, this signal content is captured from portions of the first harmonic image that extend into the bandwidth $-f_S/2$ to $f_S/2$. In particular, lower portion 511 of the first harmonic centered on sampling frequency $f_S$ falls within the bandwidth $-f_S/2$ to $f_S/2$ and substantially provides the signal content lost in lower portion 501 of the baseband, and upper portion 512 of the first harmonic centered on negative sampling frequency $-f_S$ falls within the bandwidth $-f_S/2$ to $f_S/2$ and substantially provides the signal content lost in the upper portion 502 of the baseband. In other words, the signal content in the lower portion 511 and the upper portion 512 of the first harmonic image is folded into the bandwidth $-f_{S\_}/2$ to $f_S/2$, such that all of the signal content of the IF signal is present at the relatively high gain.

FIG. 5C is an expanded view of FIG. 5B, showing overlapping portions of the baseband and first harmonic images within the bandwidth 0 to $f_S/2$ (half the bandwidth $-f_S/2$ to $f_S/2$). As shown in FIG. 5C, the center portion 500 of the baseband image provides signal content of about the center third of the IF signal, the lower portion 511 of the first harmonic image provides signal content of about the lower third of the IF signal, and the upper portion 512 of the first harmonic image provides signal content of about the upper third of the IF signal. Accordingly, the entire signal content is present within the bandwidth $-f_S/2$ to $f_S/2$.

Figure 6:
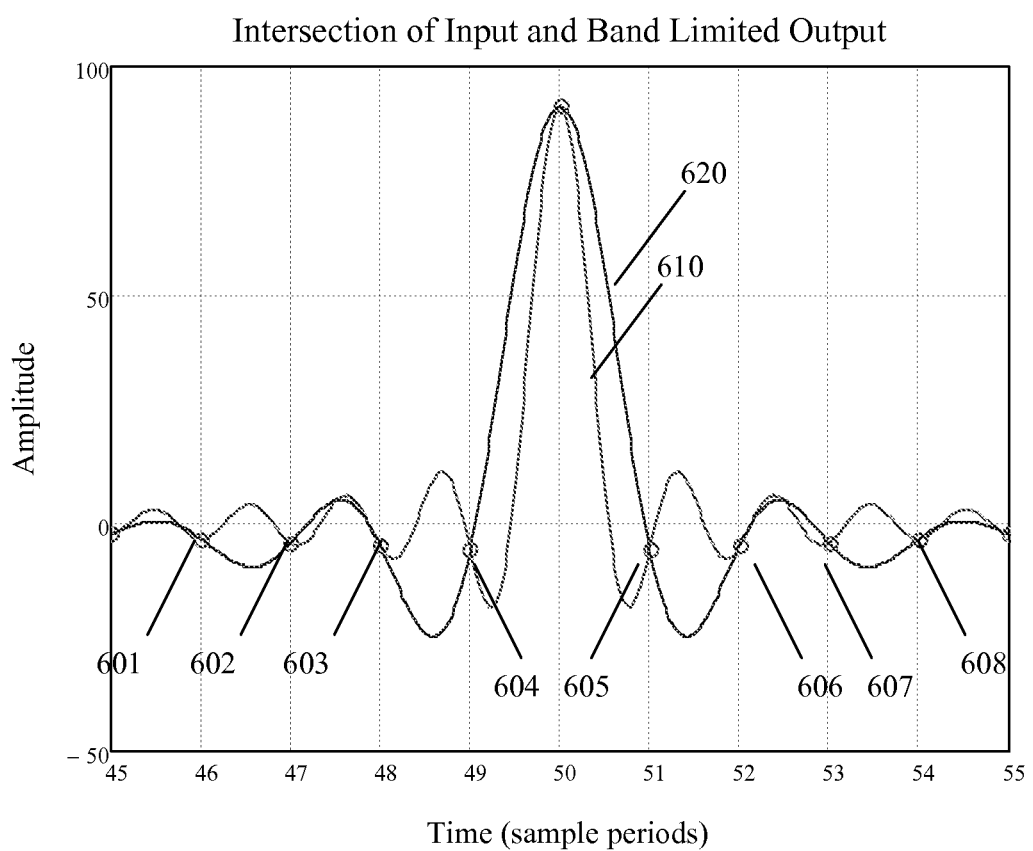
FIG. 6 is a graph showing impulse response traces of an illustrative input signal and a corresponding sampled signal output by a synthetic sampling system, according to a representative embodiment.

FIG. 6 is a graph showing impulse response traces of an illustrative RF input signal and a corresponding sampled signal output by a synthetic sampling system, according to a representative embodiment.

Referring to FIG. 6, RF input signal (trace 610) is band limited to less than $f_S$, but greater than $f_S/2$ and the output sampled signal (trace 620) of the synthetic sampling system is band limited to $f_S/2$, as shown for example in FIG. 4B, discussed above. The circles 601-608 correspond to points at which trace 620 (the sampled signal) intersects the vertical grid lines of the graph, where the horizontal grid is spaced at integer numbers of the sample period. As shown FIG. 6, trace 610 (the RF input signal) also passes through the circles 601-608, showing that readings taken from the sampled signal, which has half the bandwidth of the RF input signal, accurately reflect the RF input signal.

Figure 7:
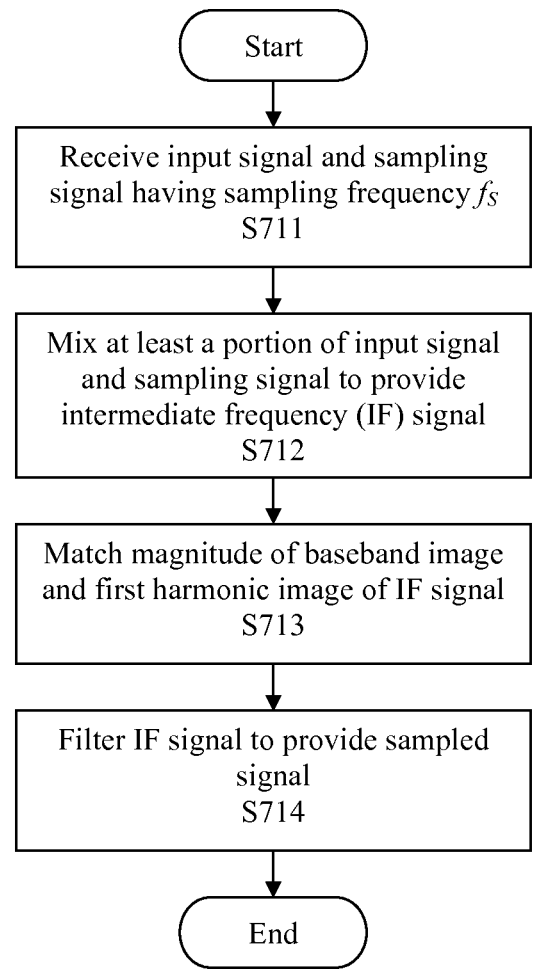
FIG. 7 is a flow diagram illustrating a method for synthetically sampling an input signal, according to a representative embodiment.

FIG. 7 is a flow diagram illustrating a method for synthetically sampling an input signal, according to a representative embodiment.

Referring to FIG. 7, an RF input signal and a sampling signal having a sampling frequency are received at a doubly balanced mixer (e.g., mixer 120, 220) in block S711. At least a portion of the RF input signal is mixed with the sampling signal in block S712 to provide an intermediate frequency (IF) signal having at least a first harmonic image. In block S713, a magnitude of at least one of the first harmonic image and a baseband image is adjusted, so that the magnitude of the first harmonic image matches the magnitude of the baseband image. The IF signal (or IF signal combined with a portion of a split RF input signal) may be filtered in block S714 to limit an upper end of a bandwidth of the IF signal to one half of the sampling frequency to provide the sampled signal.

Mixing at least a portion of the RF input signal and the sampling signal in block S712 may include introducing an offset voltage (e.g., DC offset) with the sampling signal, which provides the baseband image in the IF signal. When the offset voltage is introduced in this manner, the magnitude of the baseband image may be adjusted in block S713 by adjusting the offset voltage until the magnitude of the baseband image is the same as the magnitude of the first harmonic image of the IF signal.

Alternatively, the RF input signal may be split into a first split input signal and a second split input signal, each of which has a full bandwidth of the RF signal, before the RF input signal is mixed with the sampling signal. In this case, mixing at least a portion of the RF input signal and the sampling signal in block S712 includes mixing only the first split signal and the sampling signal to provide the IF signal. Then, the IF signal is summed or otherwise combined with the second split signal (which has not been mixed with the sampling signal) to provide a combined IF signal. Since the second split input signal includes the baseband image and the IF signal includes the first harmonic image, the combined IF signal includes both the baseband image and the first harmonic image. Therefore, the magnitude of the baseband image may be adjusted in block S713 by adjusting the magnitude of the baseband image of the second split input signal and/or the magnitude of the first harmonic image of the IF signal. For example, the magnitude of the first harmonic image of the IF signal may be adjusted (e.g., by a buffer amplifier) before summing the IF signal and the second split input signal.

The method may further include phase locking the sampling signal and the recording device's sample clock to enable digitizing the sampled signal. For example, the sampled signal may be received by an oscilloscope, which includes an ADC or other digitizing circuit. The digitizing circuit may be phase locked with a sample clock, for example, which generates the sampling signal.

The various embodiments described herein provide higher signal-to-noise ratios (i.e., less gain loss) than conventional narrow aperture sampling circuits, and provide higher bandwidth than conventional track and hold circuits. Narrow aperture sampling circuits, in particular, output several signal images at low signal-to-noise ratios symmetric about the sampling frequency and its harmonics, e.g., as shown in FIGS. 3B, 4A and 5A. These images contain redundant signal content. Thus, most of the spectrum at the output of a narrow aperture sampling circuit cannot be recorded by a reasonable ADC, and must be band limited. In contrast, the bandwidth of the sampled signal output by the synthetic sampling system (e.g., sampling system 100, 200) to be recorded is the minimum bandwidth (e.g., half the sampling frequency $f_S$) necessary to provide the required signal content.

While the disclosure references exemplary embodiments, it will be apparent to those skilled in the art that various changes and modifications may be made without departing from the spirit and scope of the present teachings. Therefore, it should be understood that the above embodiments are not limiting, but illustrative.

What is claimed is:

1. A system for synthetically sampling an input signal to provide a sampled signal, the system comprising:
   a sample clock configured to generate a sampling signal having a sampling frequency; and a mixer configured to receive the sampling signal and the input signal, and to output an intermediate frequency (IF) signal having a first harmonic image by mixing the sampling signal and the input signal, wherein an offset voltage is introduced into the mixer with the sampling signal to add a baseband image to the first harmonic image, the offset voltage being adjusted so that the baseband image of the IF signal has the same magnitude as the first harmonic image of the IF signal.

2. The system of claim 1, further comprising:
a low-pass filter configured to limit the IF signal output by the mixer to a bandwidth centered on zero and contained between one half of the sampling frequency and negative one half of the sampling frequency, and to output a filtered IF signal as the sampled signal, the sampled signal containing the entire signal content of the input signal.

3. The system of claim 1, wherein the mixer comprises a doubly balanced mixer.

4. The system of claim 3, wherein the offset voltage comprises a DC offset.

5. The system of claim 2, wherein the sampled signal is recorded by an oscilloscope comprising an analog-to-digital converter (ADC), and
wherein the sample clock is phase locked to a digitizing process in the ADC of the oscilloscope, such that a waveform of the sampled signal is digitized at a proper phase.

6. A system for synthetically sampling an input signal to provide a sampled signal, the system comprising:
a sample clock configured to generate an sampling signal having a sampling frequency;
a splitter configured to split the input signal into a first split input signal and a second split input signal;
a mixer configured to receive the sampling signal and the first split input signal, and to output an intermediate frequency (IF) signal having an intermediate frequency by mixing the sampling signal and the first split input signal, the IF signal comprising a first harmonic image; and
a combiner configured to sum the IF signal output by the mixer and the second split input signal having a baseband image output by the splitter, and to output a combined IF signal at the intermediate frequency, wherein a magnitude of at least one of the IF signal and the second split input signal is adjusted, so that a magnitude of the baseband image provided by the second split input signal matches a magnitude of the first harmonic image provided by the IF signal in the combined IF signal output by the combiner.

7. The system of claim 6, further comprising:
a low-pass filter configured to limit the combined IF signal output by the combiner to a bandwidth centered on zero and contained between one half of the sampling frequency and negative one half of the sampling frequency, and to output a filtered combined signal as the sampled signal, the sampled signal containing the entire signal content of the input signal.

8. The system of claim 7, wherein the sampling signal has zero offset.

9. The system of claim 7, wherein the splitter comprises one of a diplexer, a power splitter or an amplifier having two outputs.

10. The system of claim 7, wherein the combiner comprises a power splitter connected in reverse order or an amplifier having two inputs.

11. The system of claim 7, further comprising:
a buffer amplifier configured to adjust the magnitude of the IF signal.

12. The system of claim 7, wherein the sampled signal is recorded by a receiver comprising an analog-to-digital converter (ADC), and
wherein the sample clock is phase locked to a digitizing process in the ADC, such that a waveform of the sampled signal is digitized at a proper phase.

13. A method of synthetically sampling a radio frequency (RF) input signal to provide a sampled signal, the method comprising:
receiving the RF input signal and a sampling signal having a sampling frequency;
mixing at least a portion of the RF input signal and the sampling signal and adding a baseband image to provide an intermediate frequency (IF) signal having a first harmonic image and the baseband image; and
adjusting a magnitude of at least one of the first harmonic image and the baseband image so that the magnitude of the first harmonic image matches the magnitude of the baseband image.

14. The method of claim 13, further comprising:
filtering the IF signal to limit an upper end of a bandwidth of the IF signal to one half of the sampling frequency to provide the sampled signal, the sampled signal containing the entire signal content of the input signal.

15. The method of claim 13 wherein adding the baseband image comprises introducing a DC offset with the sampling signal to a mixer receiving the RF input signal and the sampling signal, and
wherein adjusting the magnitude of at least one of the first harmonic image and the baseband image comprises adjusting the DC offset to adjust the magnitude of the baseband image to match the magnitude of the first harmonic image of the IF signal.

16. The method of claim 13, further comprising:
splitting the RF input signal into a first split input signal and a second split input signal, each of the first and second split input signals having a full bandwidth of the RF signal, wherein mixing at least a portion of the RF input signal and the sampling signal comprises mixing the first split input signal and the sampling signal to provide the IF signal having the first harmonic image, wherein adding the baseband image comprises summing the IF signal having the first harmonic image and the second split signal having the baseband image to provide a combined IF signal.

17. The method of claim 16, wherein adjusting the magnitude of at least one of the first harmonic image and the baseband image comprises adjusting the magnitude of the first harmonic image of the IF signal before summing the IF signal and the second split input signal.

18. The method of claim 14, further comprising:
phase locking the sampling signal and the sampled signal; and
digitizing the phase locked sampled signal.

19. The system of claim 2, wherein signal content of the IF signal outside the bandwidth of the low-pass filter is captured from the first harmonic image, portions of which extend into the bandwidth of the low-pass filter.

20. The system of claim 7, wherein signal content of the IF signal outside the bandwidth of the low-pass filter is captured from the first harmonic image, portions of which extend into the bandwidth of the low-pass filter.

* * * * *

UNITED STATES PATENT AND TRADEMARK OFFICE
CERTIFICATE OF CORRECTION

| | |
|---|---|
| PATENT NO. | : 9,794,057 B1 |
| APPLICATION NO. | : 13/097882 |
| DATED | : October 17, 2017 |
| INVENTOR(S) | : Kenneth Rush |

It is certified that error appears in the above-identified patent and that said Letters Patent is hereby corrected as shown below:

In Column 11, Line 59, in Claim 8, delete "claim 7," and insert -- claim 6, --, therefor.

In Column 11, Line 61, in Claim 9, delete "claim 7," and insert -- claim 6, --, therefor.

In Column 11, Line 64, in Claim 10, delete "claim 7," and insert -- claim 6, --, therefor.

In Column 12, Line 1, in Claim 11, delete "claim 7," and insert -- claim 6, --, therefor.

Signed and Sealed this
Thirteenth Day of February, 2018

Andrei Iancu
*Director of the United States Patent and Trademark Office*